(12) United States Patent
Hemenway et al.

(10) Patent No.: US 10,261,261 B2
(45) Date of Patent: Apr. 16, 2019

(54) PASSIVELY ALIGNED SINGLE ELEMENT TELESCOPE FOR IMPROVED PACKAGE BRIGHTNESS

(71) Applicant: nLIGHT, Inc., Vancouver, WA (US)

(72) Inventors: David Martin Hemenway, Beaverton, OR (US); David C. Dawson, Brush Prairie, WA (US); Wolfram Urbanek, Camas, WA (US)

(73) Assignee: nLIGHT, Inc., Vancouver, WA (US)

(*) Notice: Subject to any disclaimer, the term of this patent is extended or adjusted under 35 U.S.C. 154(b) by 0 days.

(21) Appl. No.: 15/435,117

(22) Filed: Feb. 16, 2017

(65) Prior Publication Data
US 2017/0235057 A1    Aug. 17, 2017

Related U.S. Application Data

(60) Provisional application No. 62/295,984, filed on Feb. 16, 2016.

(51) Int. Cl.
*G02B 6/28* (2006.01)
*G02B 6/32* (2006.01)
(Continued)

(52) U.S. Cl.
CPC .............. *G02B 6/32* (2013.01); *G02B 6/425* (2013.01); *G02B 6/4206* (2013.01); *G02B 19/0009* (2013.01); *G02B 19/0014* (2013.01); *G02B 19/0052* (2013.01); *G02B 19/0057* (2013.01); *G02B 27/0955* (2013.01); *G02B 27/0966* (2013.01); *G02B 27/123* (2013.01); *G02B 27/30* (2013.01); *H01S 5/4012* (2013.01);
(Continued)

(58) Field of Classification Search
CPC .. G02B 6/4246; G02B 6/2938; G02B 6/4214; G02B 6/4215; G02B 6/28; G02B 6/32
See application file for complete search history.

(56) References Cited

U.S. PATENT DOCUMENTS 3,622,906 A    11/1971    Nyul
3,827,059 A    7/1974    Rambauske
(Continued)

FOREIGN PATENT DOCUMENTS

CN    1829015    9/2006
CN    1975507    6/2007
(Continued)

OTHER PUBLICATIONS

Lens Cell, Crossed Cylinders, Pearl Drawing, 1 page (Feb. 22, 2007).
(Continued)

*Primary Examiner* — Jennifer Doan
(74) *Attorney, Agent, or Firm* — Klarquist Sparkman, LLP

(57) ABSTRACT

Beam compressors include separated surfaces having positive and negative optical powers. A surface spacing is selected so that a collimated beam input to the beam compressor is output as a collimated beam. In some examples, beam compressors are situated to compress a laser beam stack that includes beams associated with a plurality of laser diodes. Beam compression ratios are typically selected so that a compressed beam stack focused into an optical waveguide has a numerical aperture corresponding to the numerical aperture of the optical waveguide.

18 Claims, 11 Drawing Sheets

(51) Int. Cl.
   *G02B 6/42*    (2006.01)
   *G02B 19/00*   (2006.01)
   *G02B 27/12*   (2006.01)
   *G02B 27/30*   (2006.01)
   *G02B 27/09*   (2006.01)
   *H01S 5/40*    (2006.01)
   H01S 5/00      (2006.01)
   H01S 5/022     (2006.01)

(52) U.S. Cl.
   CPC ............. *H01S 5/005* (2013.01); *H01S 5/0071* (2013.01); *H01S 5/02284* (2013.01)

(56) References Cited

U.S. PATENT DOCUMENTS

| | | | |
|---|---|---|---|
| 4,151,582 A * | 4/1979 | Grunberger | G02B 6/2817 362/297 |
| 4,550,333 A | 10/1985 | Ridder et al. | |
| 4,609,262 A * | 9/1986 | Fujikawa | G02B 3/04 359/719 |
| 4,689,482 A | 8/1987 | Horikawa et al. | |
| 4,716,568 A | 12/1987 | Scifres et al. | |
| 4,719,631 A | 1/1988 | Conaway | |
| 4,828,357 A | 5/1989 | Arata et al. | |
| 5,048,911 A | 9/1991 | Sang et al. | |
| 5,077,750 A | 12/1991 | Pocholle et al. | |
| 5,105,430 A | 4/1992 | Mundinger et al. | |
| 5,168,401 A | 12/1992 | Endriz | |
| 5,251,060 A | 10/1993 | Uenishi et al. | |
| 5,305,344 A | 4/1994 | Patel | |
| 5,319,528 A | 6/1994 | Raven | |
| 5,515,391 A | 5/1996 | Endriz | |
| 5,610,930 A | 3/1997 | Macomber et al. | |
| 5,668,822 A | 9/1997 | Tada | |
| 5,764,675 A | 6/1998 | Juhala | |
| 5,825,551 A | 10/1998 | Clarkson et al. | |
| 5,828,683 A | 10/1998 | Freitas | |
| 5,887,096 A | 3/1999 | Du et al. | |
| 5,898,211 A | 4/1999 | Marshall et al. | |
| 5,909,458 A | 6/1999 | Freitas et al. | |
| 5,986,794 A | 11/1999 | Krause et al. | |
| 5,987,043 A | 11/1999 | Brown et al. | |
| 6,028,722 A | 2/2000 | Lang | |
| 6,041,072 A | 3/2000 | Ventrudo et al. | |
| 6,044,096 A | 3/2000 | Wolak et al. | |
| 6,057,871 A | 5/2000 | Peterson | |
| 6,075,912 A | 6/2000 | Goodman | |
| 6,115,185 A | 9/2000 | Du et al. | |
| 6,124,973 A | 9/2000 | Du et al. | |
| 6,212,310 B1 | 4/2001 | Waarts et al. | |
| 6,229,831 B1 | 5/2001 | Nightingale et al. | |
| 6,240,116 B1 | 5/2001 | Lang et al. | |
| 6,266,359 B1 | 7/2001 | Taheri et al. | |
| 6,324,320 B1 | 11/2001 | Goodman | |
| 6,327,285 B1 | 12/2001 | Wang | |
| 6,377,410 B1 | 4/2002 | Wang et al. | |
| 6,440,778 B1 | 8/2002 | Okada et al. | |
| 6,462,883 B1 | 10/2002 | Wang et al. | |
| 6,552,853 B2 | 4/2003 | Goodman | |
| 6,556,352 B2 | 4/2003 | Wang et al. | |
| 6,636,538 B1 | 10/2003 | Stephens | |
| 6,673,699 B2 | 1/2004 | Hubbard et al. | |
| 6,680,800 B1 | 1/2004 | Schreiber et al. | |
| 6,683,727 B1 | 1/2004 | Goring et al. | |
| 6,700,709 B1 | 3/2004 | Fermann | |
| 6,710,926 B2 | 3/2004 | Beach et al. | |
| 6,765,725 B1 | 7/2004 | Fermann et al. | |
| 6,778,732 B1 | 8/2004 | Fermann | |
| 6,898,222 B2 | 5/2005 | Hennig et al. | |
| 6,903,863 B1 | 6/2005 | Carniel et al. | |
| 6,975,659 B2 | 12/2005 | Nagano et al. | |
| 7,420,996 B2 | 9/2008 | Schulte et al. | |
| 7,436,868 B2 | 10/2008 | Schulte et al. | |
| 7,443,895 B2 | 10/2008 | Schulte et al. | |
| 7,537,395 B2 | 5/2009 | Savage-Leuchs | |
| 7,586,963 B2 | 9/2009 | Schulte et al. | |
| 7,733,932 B2 | 6/2010 | Faybishenko | |
| 7,751,458 B2 | 7/2010 | Regaard et al. | |
| 7,764,723 B2 | 7/2010 | Ovtchinnikov et al. | |
| 7,830,608 B2 | 11/2010 | Hu | |
| 7,848,372 B2 | 12/2010 | Schulte et al. | |
| 7,947,517 B2 | 5/2011 | Hisa | |
| 8,000,360 B2 | 8/2011 | Faybishenko | |
| 8,066,389 B2 | 11/2011 | Silverstein et al. | |
| 8,126,028 B2 | 2/2012 | Clifford, Jr. | |
| 8,339,598 B2 | 12/2012 | Ban et al. | |
| 8,427,749 B2 | 4/2013 | Du et al. | |
| 8,432,945 B2 | 4/2013 | Faybishenko | |
| 8,437,086 B2 | 5/2013 | Du et al. | |
| 8,488,245 B1 | 7/2013 | Chann | |
| 8,508,729 B2 | 8/2013 | Ban et al. | |
| 8,553,221 B2 | 10/2013 | Volodin et al. | |
| 8,599,485 B1 | 12/2013 | Cobb | |
| 8,654,326 B2 | 2/2014 | Volodin et al. | |
| 8,711,894 B2 | 4/2014 | Chuyanov et al. | |
| 8,830,587 B2 | 9/2014 | Bhatia et al. | |
| 8,842,369 B2 | 9/2014 | Li | |
| 8,861,082 B2 | 10/2014 | Cobb | |
| 8,873,134 B2 | 10/2014 | Price et al. | |
| 8,891,579 B1 | 11/2014 | Price et al. | |
| 8,942,521 B2 | 1/2015 | Song et al. | |
| 9,005,262 B2 | 4/2015 | Liu et al. | |
| 9,373,932 B2 | 6/2016 | Hayamizu et al. | |
| 9,413,136 B1 | 8/2016 | Vethake et al. | |
| 9,455,552 B1 | 9/2016 | Price et al. | |
| 9,705,289 B2 | 7/2017 | Kanskar et al. | |
| 9,720,145 B2 | 8/2017 | Kanskar | |
| 2004/0114027 A1 | 6/2004 | Frith | |
| 2004/0252388 A1 | 12/2004 | Yamanaka et al. | |
| 2006/0165144 A1 | 7/2006 | Mikhailov et al. | |
| 2006/0280209 A1 | 12/2006 | Treusch | |
| 2007/0047401 A1 | 3/2007 | Sun | |
| 2007/0116071 A1 | 5/2007 | Schulte et al. | |
| 2007/0116077 A1 | 5/2007 | Farmer et al. | |
| 2007/0217467 A1 | 9/2007 | DeFranza et al. | |
| 2007/0217468 A1 | 9/2007 | DeFranza et al. | |
| 2007/0217469 A1 | 9/2007 | DeFranza et al. | |
| 2007/0217470 A1 | 9/2007 | DeFranza et al. | |
| 2007/0217471 A1 | 9/2007 | DeFranza et al. | |
| 2007/0236781 A1 | 10/2007 | Fidric | |
| 2007/0268572 A1 | 11/2007 | Hu | |
| 2007/0268945 A1 | 11/2007 | Schulte et al. | |
| 2007/0268946 A1 | 11/2007 | Schulte et al. | |
| 2007/0268947 A1 | 11/2007 | Schulte et al. | |
| 2008/0019010 A1 | 1/2008 | Govorkov et al. | |
| 2009/0323752 A1 | 12/2009 | Chuyanov et al. | |
| 2010/0158060 A1 | 6/2010 | Faybishenko | |
| 2010/0226405 A1 | 9/2010 | Chuyanov et al. | |
| 2013/0148684 A1 | 6/2013 | Guo et al. | |
| 2013/0162956 A1 | 6/2013 | Okuda | |
| 2013/0194801 A1 | 8/2013 | Wolf et al. | |
| 2014/0036375 A1 | 2/2014 | Chann et al. | |
| 2014/0300971 A1 | 10/2014 | Wolak et al. | |
| 2015/0055667 A1 | 2/2015 | Horn et al. | |
| 2015/0131692 A1 | 5/2015 | Hayamizu et al. | |
| 2015/0280404 A1 | 10/2015 | Kasai et al. | |
| 2015/0295386 A1 | 10/2015 | Hemenway et al. | |
| 2015/0349481 A1 | 12/2015 | Kliner | |
| 2016/0181764 A1 | 6/2016 | Kanskar et al. | |
| 2017/0271837 A1 | 9/2017 | Hemenway et al. | |
| 2018/0183214 A1 | 6/2018 | Dawson et al. | |

FOREIGN PATENT DOCUMENTS

| | | |
|---|---|---|
| CN | 101141051 | 3/2008 |
| CN | 101144909 | 3/2008 |
| CN | 201113224 | 9/2008 |
| CN | 201515142 | 6/2010 |
| CN | 102074896 | 5/2011 |
| CN | 102437509 | 5/2012 |
| CN | 202548385 | 11/2012 |
| CN | 202720390 | 2/2013 |
| CN | 203071399 | 7/2013 |

(56) References Cited

FOREIGN PATENT DOCUMENTS

| CN | 103368066 | 10/2013 |
|---|---|---|
| CN | 103401136 | 11/2013 |
| EP | 0721113 | 7/1996 |
| RU | 2010143026 | 4/2012 |
| WO | WO 2005059626 | 6/2005 |

OTHER PUBLICATIONS

International Search Report and Written Opinion from International Application No. PCT/US2017/018210, dated May 8, 2017, 12 pages.
Edwin, "Stripe Stacker for Use with Laser Diode Bars," Optics Letters, 20:222-224 (Jan. 15, 1995).
International Search Report and Written Opinion for International Application No. PCT/US2015/019288, dated Jun. 10, 2015.
International Search Report and Written Opinion for related International Application No. PCT/US2017/023067, 12 pages, dated Jun. 27, 2017.
International Preliminary Report on Patentability from International Application No. PCT/US2017/018210, dated Aug. 21, 2018, 8 pages.

\* cited by examiner

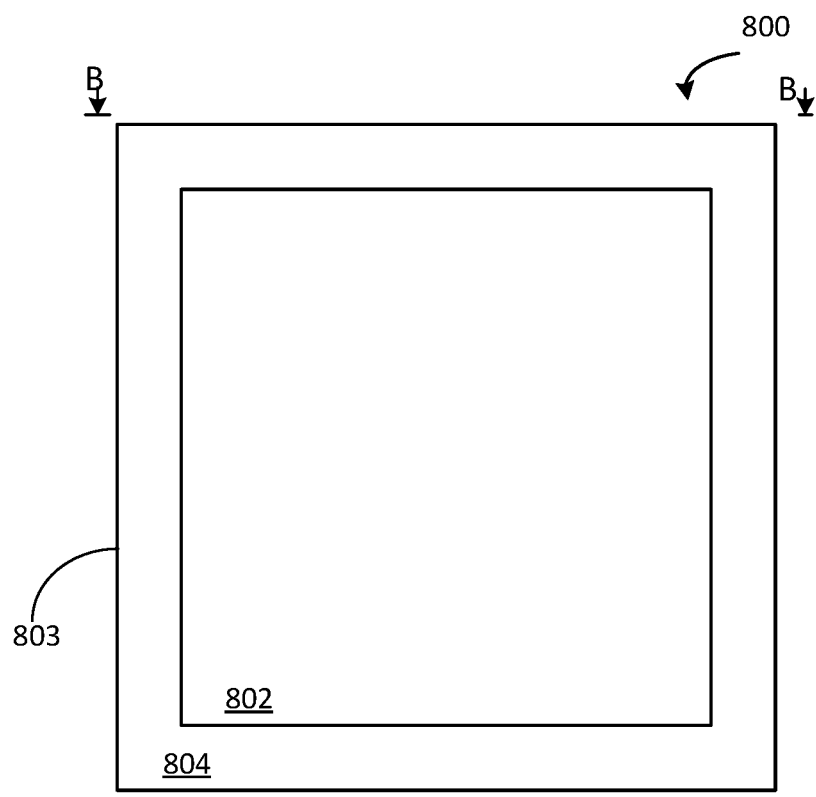
FIG. 8A
FIG. 8B
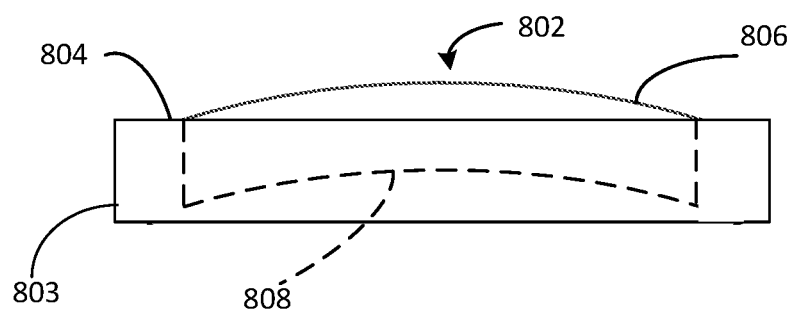

PASSIVELY ALIGNED SINGLE ELEMENT TELESCOPE FOR IMPROVED PACKAGE BRIGHTNESS

CROSS REFERENCE TO RELATED APPLICATION

This application claims the benefit of U.S. Provisional Application No. 62/295,984, filed Feb. 16, 2016, which is incorporated herein by reference in its entirety.

FIELD

The disclosure pertains to laser beam combining optics and laser assemblies using such optics.

BACKGROUND

Laser diodes have been developed that produce substantial output powers that make possible a variety of applications. To further increase available optical power, laser diode assemblies have been produced in which output beams from a plurality of laser diodes are combined. In one example, laser diodes are arranged in a stair-step pattern and collimated beams from the laser diodes are formed into a beam stack. An objective lens receives the beam stack and focuses the beam stack to an input surface of an optical fiber. Total available power can be increased by increasing the number of laser diodes. However, the laser diodes used to form the beam stack must be spaced apart, so that a number of beams in a beam stack delivered to an objective lens is limited by a size of the beam stack. Thus, the number of beams that can be practically combined is limited. Conventional approaches to controlling beam stack size can be complex, and often require precision alignment in manufacturing. Alternative approaches are needed.

SUMMARY

The disclosed embodiments generally pertain to unitary optics such as, for example, spherical or cylindrical singlets, that alter laser beam spacing in a laser beam stack. These unitary optics include optical surfaces that are suitably aligned during manufacture and can also be provided with one or more reference surfaces that permit simple alignment with a laser beam stack. In typical examples, a laser beam stack dimension is to be decreased and the unitary optical systems are referred to as beam compressors, although whether a beam stack is compressed or expanded typically is a function of the orientation of such an optical system, and not of the design of the optical system itself. In many examples, compression along an axis referred to as a "fast" axis is intended, and the associated optics are based on cylindrical surfaces or other surfaces having cylindrical optical power. In these applications, a beam compressor is also referred to as a fast axis telescope (FAT). Typically FATs are based on a meniscus lens and are referred to herein as meniscus FATs.

In some examples, beam compressors comprise a transmissive optical substrate having a first surface having a first curvature and a second surface having a second curvature. The first surface and the second surface are situated on and separated along an optical axis so that an incoming beam propagating parallel to the optical axis and displaced from the optical axis to the transmissive optical substrate is transmitted by the transmissive optical substrate so as to propagate parallel to the optical axis and displaced from the optical axis by a distance that is based on the displacement of the incoming beam from the optical axis, the first curvature, and the second curvature. According to representative examples, the first curvature is a spherical curvature and the second curvature is a spherical curvature, or the first curvature is a cylindrical curvature and the second curvature is a cylindrical curvature. In representative embodiments, the first curvature and the second curvature are associated with respective spherical or cylindrical radii of curvature $R_1$ and $R_2$, a substrate refractive index is n, and a center thickness $$T_C = \frac{n}{\Delta n}(R_1 - |R_2|).$$

In some examples, the first curvature and the second curvature are associated with respective focal lengths $f_1$ and $f_2$, wherein $f_2<0$, a substrate refractive index is n, and a center thickness $T_C=n(f_1+f_2)$. In other embodiments, the first curvature and the second curvature are associated with respective radii of curvature $R_1$ and $R_2$, and a beam compression ratio $M=|R_2/R_1|$, or the first curvature and the second curvature are associated with respective focal lengths $f_1$ and $f_2$, and a beam compression ratio $M=|f_2/f_1|$.

In typical examples, beam compression ratios are between 0.25 and 2.0, 0.5 and 1.2, or 0.65 and 0.92. In some alternatives, the first surface is associated with a Fresnel lens corresponding to the first curvature and the second surface is associated with a Fresnel lens corresponding to the second curvature. In other alternatives, the first curvature and the second curvature are cylindrical curvatures and are situated so that respective axes of curvature are in a common plane, and the substrate includes an edge surface that is substantially parallel to the axes of curvature.

Laser diode assemblies comprise a plurality of laser diodes situated to direct a plurality of laser beams along respective beam axes that are displaced from and parallel to each other so as to establish initial beam displacements among the plurality of laser beams. A unitary beam compressor is situated to receive the laser beams having the initial beam displacements and produce laser output beams having reduced displacements. In some embodiments, an objective lens is situated to receive the laser beams from the unitary beam compressor and direct the laser beams to a beam focus. In further examples, an optical waveguide having an input surface is situated at the beam focus. According to some alternatives, a plurality of fast axis collimators and slow axis collimators is situated to receive the plurality of laser beams and direct the plurality of laser beams along the respective beam axes to the unitary beam compressor. In representative embodiments, the unitary beam compressor includes an optically transparent substrate situated so that a beam entrance surface has a first radius of curvature and a beam exit surface has a second radius of curvature, wherein the first radius of curvature, the second radius of curvature, and a separation of the beam exit surface and the beam entrance surface is such that a compression ratio corresponds to a ratio of the magnitudes of second radius of curvature to the first radius of curvature. In typical embodiments, the optically transparent substrate is glass, and the first radius curvature and the second radius of curvature are cylindrical curvatures having parallel axes of curvature. In other examples, the laser diodes of the plurality of laser diodes are situated so that associated beams are displaced from each other and propagate along parallel axes in a common plane, and axes of curvature of the unitary beam compressor are perpendicular to the common plane. In additional representative embodiments, the unitary beam compressor is an on-axis cylindrical lens having a convex surface of radius $R_1$ and a concave surface of radius $R_2$ and having a center thickness such that the convex and concave surfaces have an optical separation corresponding to a difference $|R_1|-|R_2|$. In some examples, the on-axis cylindrical lens has a center thickness $T_C$ of about $$T_C = \frac{n}{n-1}(|R_1| - |R_2|),$$

wherein n is a refractive index of the centered cylindrical lens.

Representative methods comprise securing a plurality of laser diodes with respect to each other so as to produce a beam stack that comprises beams from the plurality of laser diodes. A unitary beam compressor is situated with respect to the beam stack so as to alter a beam spacing in the beam stack. In typical examples, the unitary beam compressor includes a transparent optical substrate having a reference surface, and the unitary beam stack is situated with respect to the beam stack with the reference surface. In further examples, the unitary beam compressor is secured with respect to the beam stack at the reference surface. In still further examples, the unitary beam compressor is a meniscus fast axis telescope and the reference surface is parallel to axes of curvatures of meniscus surfaces.

BRIEF DESCRIPTION OF THE DRAWINGS

FIGS. 8A-8B illustrate a beam compressor that is secured to a mounting frame.

DETAILED DESCRIPTION

Figure 1A:
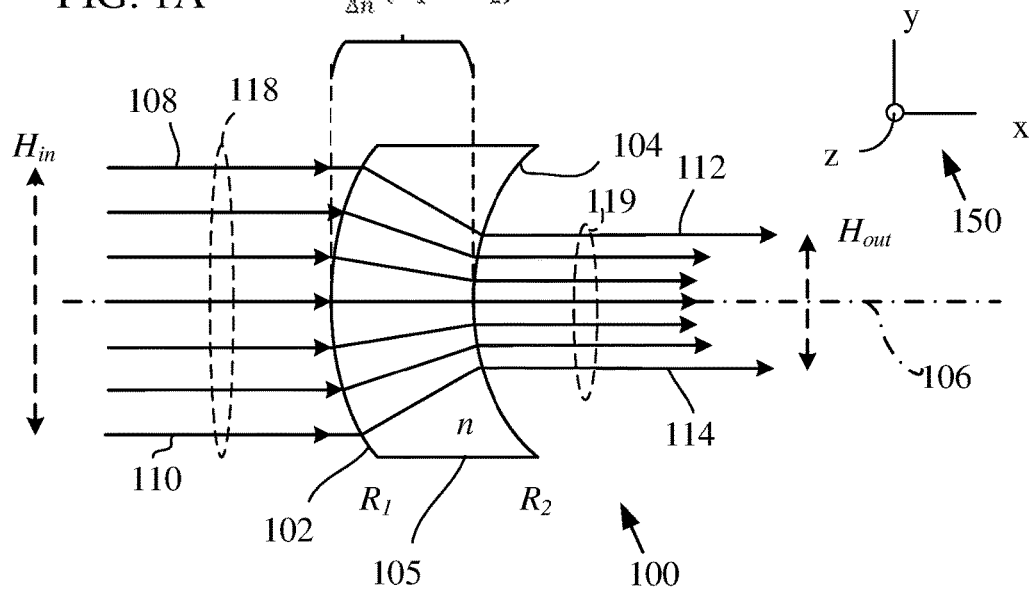
FIGS. 1A-1B illustrate a representative beam compressor implemented as a single lens.

As used in this application and in the claims, the singular forms "a," "an," and "the" include the plural forms unless the context clearly dictates otherwise. Additionally, the term "includes" means "comprises."

The described systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

In the following description, laser beams or other propagating optical radiation is referred as propagating along one or more axes. As used herein, such an axis refers to a linear axis that can bent or folded using optical elements such as prisms or mirrors. In some examples, optical elements such as cylindrical lenses or spherical lenses are referred to as centered or on-axis so as to indicate lenses having a central axis that is directed through surface centers of curvature. In other examples, off-axis lenses or lens segments can be used. Lens center thickness refers to a lens thickness taken along a principal axis that extends through surface centers of curvature. In the disclosed examples, surface curvatures generally correspond to cylindrical or spherical surfaces, but more complex curvatures can be used. Even for such more complex surfaces such as aspheric surfaces, a surface radius of curvature is generally defined based on an on-axis curvature although off-axis surface shape does not follow this curvature. Optical surfaces can be provided with anti-reflection or other coatings, but are such coatings are omitted from the disclosed examples. Beams, surfaces, and axes are generally referred to as parallel if within about 1 degree, 2 degrees, or 5 degrees.

Disclosed herein are optical systems that can be used to alter the spacing of stacked optical beams such as stacked beams produced by laser diode arrays. Such optical systems are referred to as beam compressors herein for convenience, even though such optical systems produce either beam expansion or beam compression depending on orientation. In some cases, beam compressors alter beam spacing along two axes using optical surfaces having spherical curvatures, or along a single axis using optical surfaces having cylindrical curvatures. As used herein, a surface curvature (or simply "curvature") is defined as a reciprocal of a radius of curvature. As noted above, in some cases, surface curvature varies and is not limited to either spherical or cylindrical shapes.

The disclosed beam compressors generally have a converging optical element or surface (i.e., an element having a positive optical power) followed by a diverging optical element or surface (i.e., an element having a negative optical power). These optical surfaces or elements are spaced so that an input beam or beam stack and an associated output beam or beam stack propagate along parallel axes regardless of where the input beam is incident to the converging optical element (or, if the optical system is reversed, wherein the input beam is incident to the diverging optical element in which case a beam compressor functions to expand a beam or beam stack). In many practical examples, multiple laser beams propagate in a beam stack in which the laser beams are aligned in regular one dimensional or two dimensional arrays. However beam stacks can include a plurality of irregularly arranged laser beams along one or two axes. Multiple beam compressors can be used with different orientations for beam compression along different axes and the axes need not be orthogonal.

Combined beams can be directed to a variety of targets. In typical examples, combined beams (after beam compression) are directed into an optical fiber such as a 105 μm core diameter optical fiber, but various sizes and types of fibers or other optical waveguides can be used. Combined beams are preferably focused to an optical waveguide such as an optical fiber so as to have a focused beam diameter and numerical aperture that correspond to fiber core diameter and numerical aperture.

A laser diode typically emits laser radiation from a facet that is much longer in one direction than in an orthogonal direction so that the emitted laser radiation has a smaller divergence in a direction parallel to the longer facet dimension and a larger divergence in a direction parallel to the smaller facet dimension. An axis parallel to and along the longer facet dimension is referred to as a "slow axis;" an axis parallel to and along a smaller facet dimension is referred to as a "fast axis."

A typical example of a beam compressor is a lens singlet with suitably spaced convex and concave surfaces. Such a beam compressor is typically used to compress beam spacing in a beam stack in a direction that is parallel to beam fast axes; such a beam compressor can be referred to as a fast axis telescope. It can be shown, using a paraxial approximation, that a lens singlet having surface radii $R_1$ and $R_2$ and lens center thickness $$T_C = \frac{n}{\Delta n}(R_1 + R_2),$$

wherein n is lens refractive index and $\Delta n = n-1$, can produce a beam compression ratio that is given by $M=|R_2/R_1|$. As used herein, a convex input surface is associated with a positive curvature while a concave output surface is associated with a negative curvature. Thus, lens center thickness $$T_C = \frac{n}{\Delta n}(R_1 - |R_2|).$$

In some cases, surface radii refer to spherical radii, while in other examples, surface radii are associated with cylindrical radii. In typical applications to beam forming with laser diodes, cylindrical surfaces with cylindrical radii are used in view of the differing laser beam divergences with respect to slow and fast axes.

A variety of lens materials can be used, including optical glasses, plastics, fused silica or other transparent crystalline or non-crystalline materials. Holographic optical elements can also be used, and secured to a common optically transparent window of a suitable thickness. Window thickness can be selected as above, wherein the surface radii of curvature are equivalent curvatures based on the properties of the holographic optical elements used. A combination of spherical or cylindrical optical surfaces can be used in combination with one or more holographic elements as well, typically formed in or on a common substrate. In other examples, one or more Fresnel lenses can be secured to a transparent substrate.

In some applications, only a narrow range of laser diode wavelengths is of interest, and dispersion in a substrate material tends to be of little concern. For such applications, optical glasses having small Abbe numbers or other relatively dispersive materials can be used. In some applications, a beam compressor is to be used with a range of wavelengths, and a material is selected for satisfactory performance over the wavelength range. For such applications, the use of a high index glass to reduce aberrations may need to be balanced against glass dispersion.

In the disclosed examples, the primary optical aberration of concern is spherical aberration. In addition, it is generally preferable to use modest curvatures for low cost manufacture. Therefore, an optical material for a beam compressor is generally selected to have a relative high index of refraction (typically between 1.65 and 1.85) to reduce spherical aberration and reduce required curvatures. As noted above, in some applications, a beam compressor is used with a range of wavelengths, and a large refractive index is selected but with a view to the associated Abbe number to reduce wavelength dependence. However, generally any optical glass can be used as may be convenient.

While unitary construction based on a single transparent substrate provides a robust and relatively inexpensive beam compressor, two optical elements such as a plano-convex lens and a plano-concave lens can be secured to each other with an optical adhesive to form a unitary beam compressor. Total center thickness and surface radii of curvature are specified in the same manner as in unitary construction but such construction does permit use of two lens materials which can be useful in reducing chromatic aberration. Plano surfaces are not required, and any surfaces suitable for forming a cemented double can be used. Similarly, Fresnel lenses or holographic optical elements can be spaced apart by and secured to a transparent substrate.

While not used in any of the disclosed examples, optical surfaces used in beam compressors are not limited to spherical or cylindrical surfaces, but aspheric surfaces such as ellipsoids, paraboloids, or other aspheric surfaces can be used. These surfaces can be radially or cylindrically symmetric as is preferred for a particular application. Some examples are described with respect to particular coordinate systems, but these coordinate systems are selected for convenient illustration, and do not imply any particular orientation.

Figure 1B:
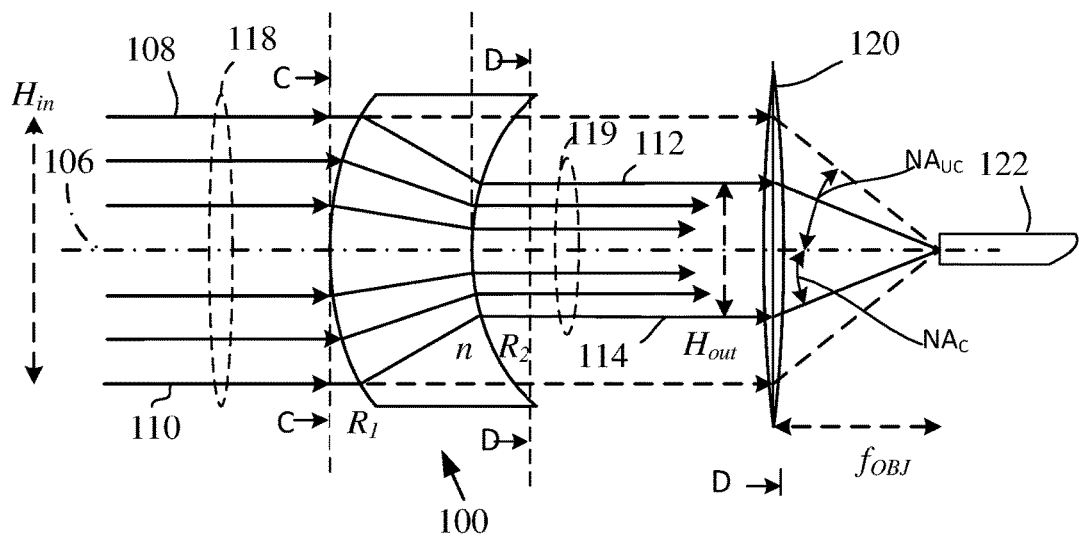

With reference to FIG. 1A, a beam compressor 100 is based on a single lens element of refractive index n and having surface radii of curvature radii $R_1$ and $R_2$ at surfaces 102, 104, respectively. As shown in FIG. 1A, an input beam stack 118 has a total beam spacing $H_{in}$ along a y-axis of a right-handed Cartesian coordinate system 150 and is directed to the beam compressor 100 parallel to a principal axis 106 so that the beam compressor produces an output beam stack 119 having a height $H_{out}$. Outermost beams 108, 110 are transmitted by the beam compressor 100 and emerge as output beams 112, 114, respectively. Note that radius $R_1>0$ and radius $R_2<0$. As shown in FIG. 1B, the compressed beam stack 119 (including the outmost output beams 112, 114) is directed to an objective lens 120 that focuses the beams into an optical fiber 122. The objective lens 120 is shown as a double convex lens, but various lens shapes or multi-element lenses can be used.

Figure 1C:
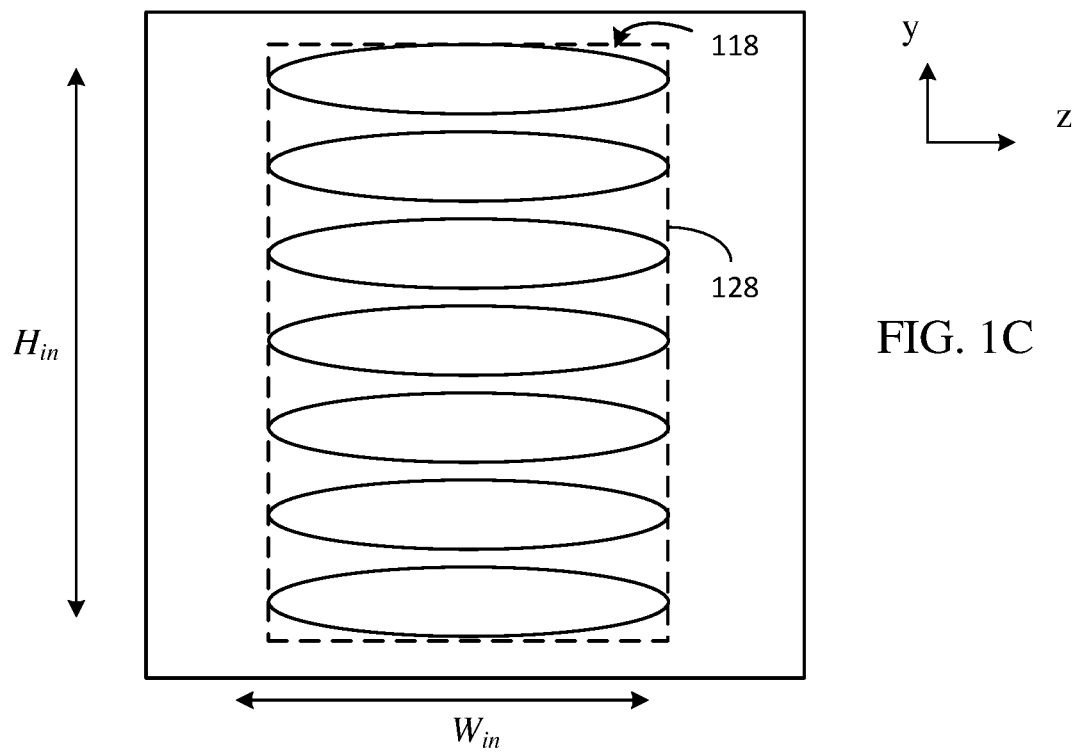
FIGS. 1C-1D illustrate beam compression along a single axis.
Figure 1D:
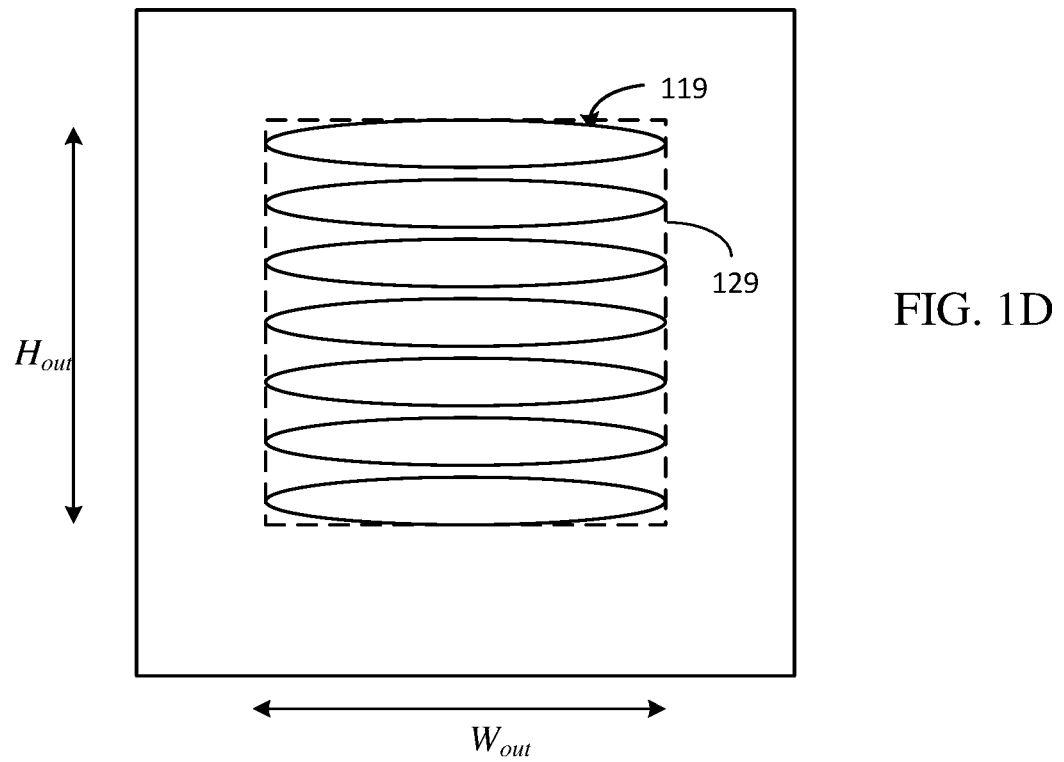

The outermost beams 112, 114 define a compressed beam numerical aperture $NA_C$ that is approximately a ratio of one-half of the beam height at the objective lens 120 to the objective lens focal length. The compressed beam numerical aperture $NA_C$ is selected to match (or to be less than) a fiber numerical aperture. FIGS. 1C-1D illustrate compression of the input beam stack 118 to form the output beam stack 119 FIG. 1C shows the input beam stack having a y-axis height $H_{in}$ and a z-axis width $W_{in}$ and thus providing optical power to a rectangular area 128. An uncompressed beam numerical aperture $NA_{UC}$ along the y-axis would be $H_{in}/2f_{OBJ}$ as illustrated in FIG. 1B. The uncompressed beam numerical aperture along the z-axis would be $W_{in}/2f_{OBJ}$. FIG. 1D shows the output (compressed) beam stack 119 having a y-axis height $H_{out}$ and a z-axis width $W_{in}$ and providing optical power to a square area 129. A compressed beam numerical aperture along the y-axis is $H_{out}/2f_{OBJ}$; in this example, as there is no beam compression along the z-axis so that compressed beam numerical aperture along the z-axis is $W_{in}/2f_{OBJ}$. In some applications, a beam stack is compressed so that numerical aperture along both the y-axis and the z-axis are about the same, i.e., so that $H_{out}=W_{in}$ and the output beam stack 119 is approximately square. A compression ratio can be selected so that $H_{out}=W_{in}$.

Figure 2:
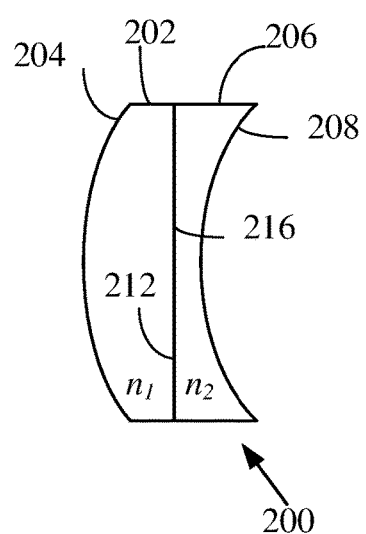
FIG. 2 illustrates a representative beam compressor implemented as a cemented doublet.

With reference to FIG. 2, a beam compressor 200 includes a first lens 202 and a second lens 206. The first lens 202 has positive optical power, and has an input surface 204 having a radius of curvature $R_1$, the second lens 206 has negative optical power and has an output surface 208 having a radius of curvature $R_2$. As shown in FIG. 2, the first lens 20l and the second lens 206 have plano surfaces 212, 216 as well but in other examples, these surfaces can have other shapes. Generally corresponding shapes are selected so that the first lens 202 and the second lenses 206 can be cemented together. One or both of the first lens 20l and the second lens 206 can be spherical or cylindrical lenses. Refractive indices $n_1$; and $n_2$ can be selected to correct aberrations such as chromatic aberration.

Figure 3:
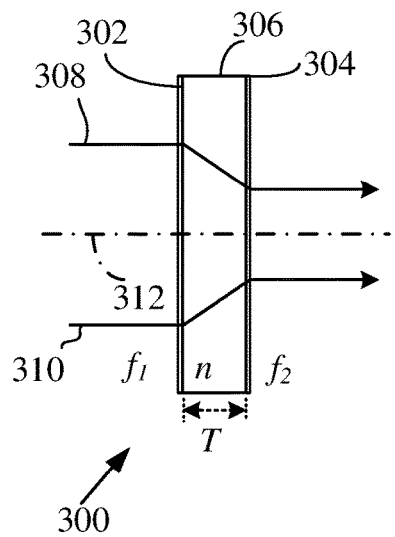
FIG. 3 illustrates a representative beam compressor based on spaced apart holographic or Fresnel lenses.

As shown in FIG. 3, an example beam compressor 300 includes a first optical element 302 and a second optical element 304 secured to opposing surfaces of a transparent substrate 306. The first optical element 302 and the second optical element 304 can be implemented as holographic optical elements, Fresnel lenses, or single or multi-element lenses. The first optical element 302, the second optical element 304, and a thickness T are selected so that incoming beams 308, 310 to the beam compressor 300 at a selected angle with respect to an optical axis 312 exit the beam compressor 300 at substantially the selected angle. In FIG. 3, the beams 308, 310 propagate parallel to the principal axis 312. Focal lengths $f_1$, $f_2$ associated with the first and second optical elements 302, 304, respectively, and the thickness T are related as $T=n(f_1+f_2)$, wherein n is a substrate refractive index. Note that $f_1>0$ and $f_2<0$.

Figure 4:
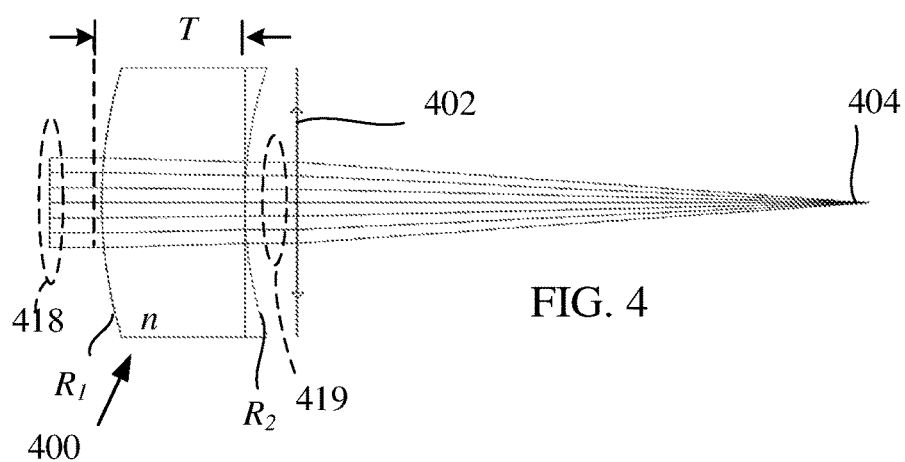
FIG. 4 is a scale drawing of a singlet beam compressor and an objective lens illustrating beam axes for a plurality of beams.

FIG. 4 is a ray trace of a set of input parallel rays 418 (corresponding to an input beam stack) propagating parallel to a principal axis of a beam compressor 400 to produce output parallel rays 419 (corresponding to a compressed beam stack). A focusing objective 402 receives the compressed parallel rays and produces a focus at 404 with a numerical aperture based on the focal length of the focusing objective 402 and the compression of the input parallel rays 418.

The table below list design values for two representative beam compressors and a focal length of one possible objective lens to be used with each of the beam compressors. The radii of curvature shown in the table can be associated with cylindrical or spherical curvatures.

| Representative Beam Compressors | | |
|---|---|---|
| Objective Focal Length (mm) | 11 | 8.9 |
| Compression Ratio | 0.9 | 0.68 |
| Substrate | N-LaF21 | N-LaF21 |
| $R_1$ (mm) | 12.0 | 9.0 |
| $R_2$ (mm) | −10.8 | −6.17 |
| $T_C$ (mm) | 2.65 | 6.47 |

Figure 5B:
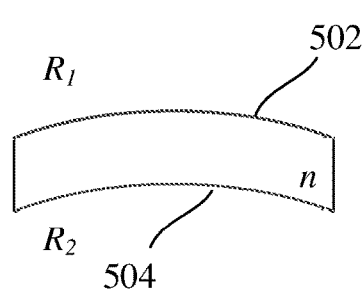
FIGS. 5A-5D illustrate a representative cylindrical single lens beam compressor.
Figure 5A:
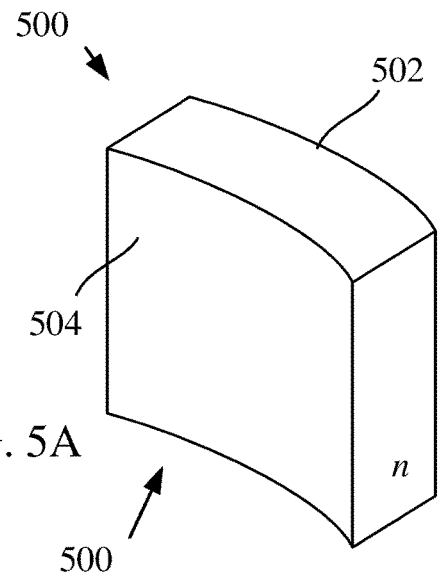
Figure 5C:
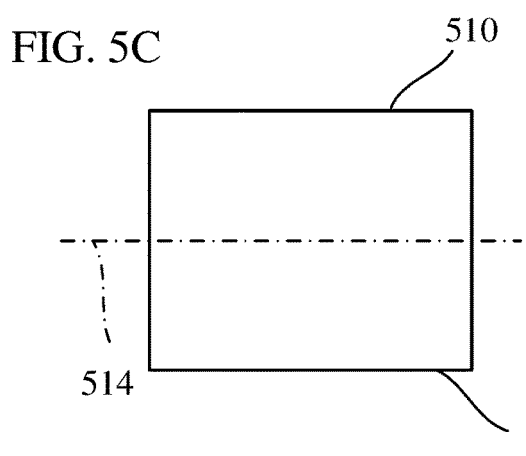
Figure 5D:
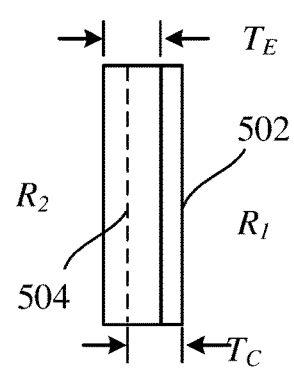

FIGS. 5A-5D illustrate a representative cylindrical single element beam compressor 500. Surfaces 502, 504 have respective cylindrical radii of curvature radii $R_1$, $R_2$ having cylindrical axes in a common plane. FIG. 5D illustrates center thickness $T_C$ and edge thickness $T_E$. An axis 514 is parallel to the cylinder axes, and one of compressor edges 510, 512 is parallel to the axis 514 so as to be used for mounting the beam compressor 500. The single element beam compressor 500 is based on a meniscus cylindrical lens, and is an example of a meniscus FAT.

Figure 6A:
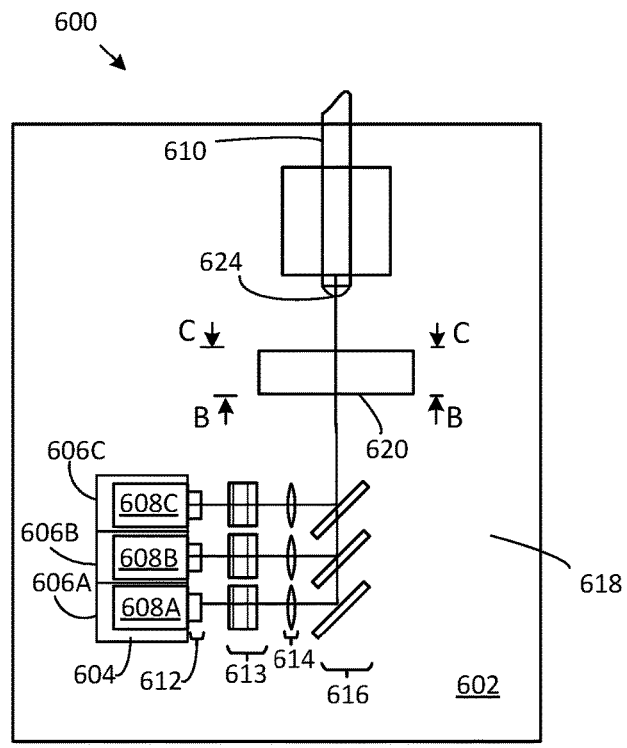
FIG. 6A illustrates a representative laser diode assembly in which a stack of three laser beams is compressed with a beam compressor.
Figure 6B:
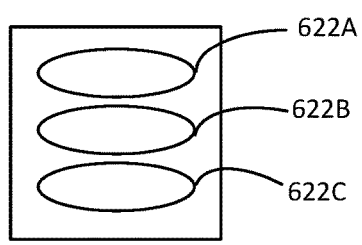
FIGS. 6B-6C illustrate single axis beam compression in the laser diode assembly of FIG. 6A.
Figure 6C:
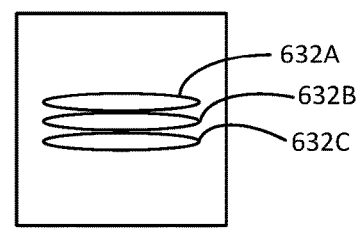

Referring to FIGS. 6A-6C, a packaged diode laser assembly 600 includes a housing 602 that is shown partially removed for convenient illustration. A stepped surface 604 includes a plurality of stepped surface portions 606A-606C to which one or more diode lasers 608A-608C, respectively, are secured so as to be situated at different heights, typically so as to monotonically descend or ascend. Typically, a single diode laser is secured to each step and the diode lasers are secured to the steps so as to emit laser radiation along substantially parallel axes. Deviations from a parallel arrangement can be compensated as needed as will be discussed below. In FIG. 6A, fast axes of the laser diodes 608A-608C are perpendicular to the plane of the figure; slow axes are in the plane of the figure. The emitted beams from the laser diodes 608A-608C are received and collimated by fast axis collimation optics 612 and slow axis collimation optics 614 to produce collimated beams. Optional volume Bragg grating elements 613 can be positioned between the fast axis collimation optics 612 and the slow axis collimation optics 614 to provide locking of the wavelength of the lasers diodes 608A-608C. Turning mirrors 616 receive the collimated beams which propagate generally parallel to each other after collimation. In the example of FIG. 6A, the turning mirrors 616 are situated to reflect the collimated beams at right angles so that the reflected beams are directed to a beam compressor 620. Propagation directions of each laser diode can be adjusted with a corresponding adjustment of the corresponding reflector. At the beam compressor 620 fast axes of the reflected beams are stacked one above another to form stacked beams 622A-622C (shown in FIG. 6B) corresponding to diode lasers 608A-608C, respectively, and having separations based on the heights of the stepped surface portions 606A-606C. The turning mirrors 616 and the slow axis collimation optics 614 can be conveniently secured to a common surface 618.

A top-most portion of each turning mirror 616 for each collimated beam is situated at a height so that the reflected beams are not clipped by subsequent turning mirrors 616. For example, in FIG. 6A, a bottom-most mirror in the drawing has the largest height to correspond with a largest step height of the corresponding stepped surface portion 606A. A spacing of the stacked beams 622A-622C is adjusted with the beam compressor 620 and then the compressed beams are directed to an objective lens 624 that directs the compressed beam into an optical fiber 610. In some examples, the objective lens 624 is a single plano-convex lens, while in other examples more complex multi-element lenses are used, including spherical and aspherical surfaces.

As shown in FIGS. 6B-6C, an input beam stack of stacked beams 622A-622C is output by the beam compressor 620 as a compressed beam stack of beams 632A-632C. Note that beam separation is compressed along with beam diameter in the direction of compression.

Figure 7A:
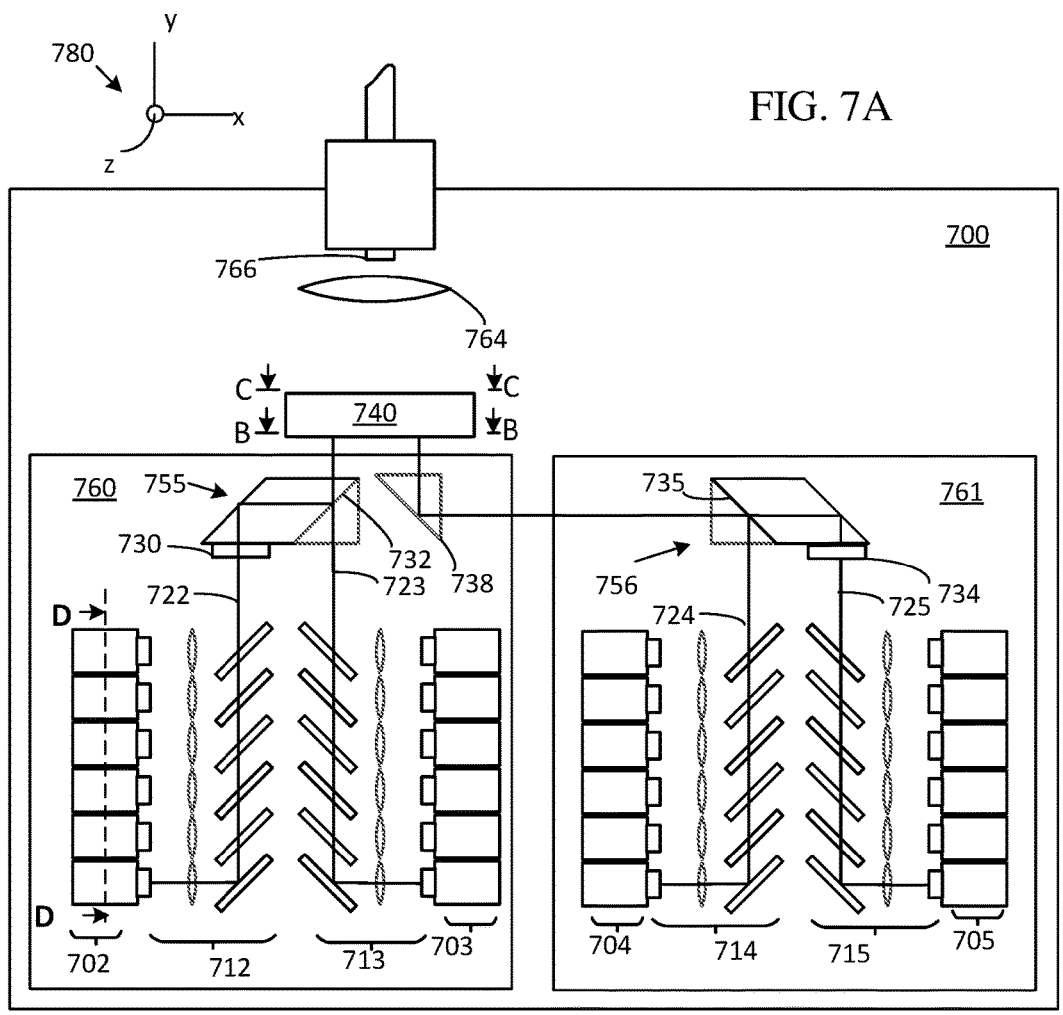
FIG. 7A illustrates a laser diode assembly in which two beam stacks are formed using polarization multiplexing, and the two beam stacks compressed using a beam compressor.
Figure 7D:
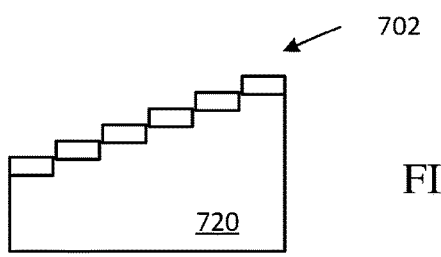
FIG. 7D illustrates a representative stair-step laser diode mount.

With reference to FIGS. 7A-7D, a diode laser assembly 700 is described with reference to a right-handed xyz coordinate system 780 in which a z-axis extends upwardly out of the plane of FIG. 7A. The diode laser assembly 700 includes sets of laser diodes 702-705 that are arranged to emit respective sets of laser beams to corresponding sets of reflectors and fast and slow axis collimators 712-715. For example, the laser diodes of the set 702 emit beams along an x-axis direction that are then redirected by respective reflectors of the set 712 so as to propagate along a y-axis direction. The laser diodes of each set are displaced or offset from other laser diodes of the same set along a z-axis and the associated reflectors situated so that laser beams from the set are not blocked by the reflectors. As shown in FIG. 7D, the set of laser diodes 702 is secured to a stepped mount 720 to provide suitable z-axis offsets; similar mounts are provided for the remaining sets of laser diodes. For convenience, beam propagation axes 722-725 are shown for the bottom-most laser diodes of each set; beam propagation axes for the remaining laser diodes of each set are similar, but displaced along the z-axis.

The laser beams from the set of laser diodes 702 are directed to a half-wave retarder 730 and then combined with the laser beams from the set of laser diodes 703 at a polarizing beam splitter 732 so that a vertically stacked set of beams 736A (shown in FIG. 7B) is incident to a beam compressor 740. The laser beams from the set of laser diodes 705 are directed by reflectors of the set 715 to a to a half-wave retarder 734 and then combined with the laser beams from the set of laser diodes 704 as redirected by reflectors of the set 714 at a polarizing beam splitter 735 so that a vertically stacked set of beams 736B is incident to the beam compressor 740.

Figure 7B:
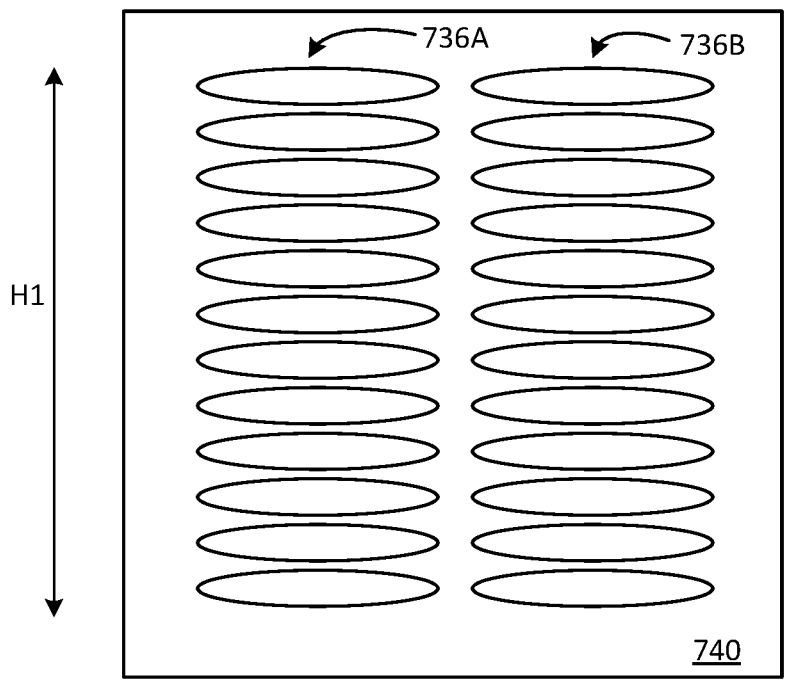
FIGS. 7B-7C illustrate a beam stack before and after compression.
Figure 7C:
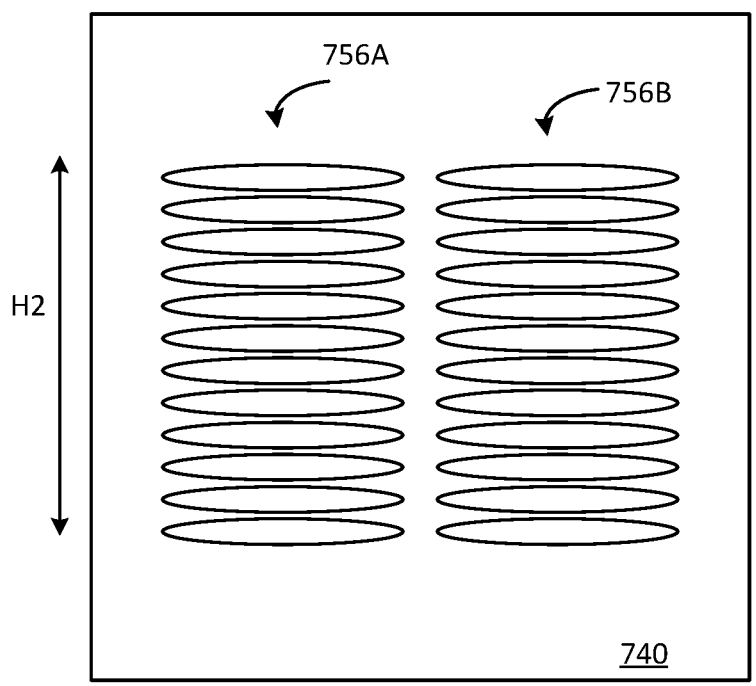

FIG. 7B illustrates the stacked beams 736A, 736B as incident to the beam compressor 740; FIG. 7C illustrates stacked beams 756A, 756B exiting the beam compressor 740, wherein both beam spacing and individual beam height are altered by a compression ratio $M=H_2/H_1$. In this example, a cylindrical beam compressor is used and there is compression in a z-direction but not in an x-direction. Additional compressors can be provided for compression in other directions, or a compressor using spherical surfaces can be used.

In the example of FIG. 7A, mounting surfaces 760, 761 are provided for the laser diodes 702, 703, respectively. Uncompressed laser beams from the laser diodes 704, 705 are directed by a prism 738 to the beam compressor 740. An objective lens 764 directs the compressed beams to an input surface 766 of an optical fiber. The polarizing beam splitters 732, 735 can be included in respective optical assemblies 755, 756 that can includes prisms that redirect the combined beams.

Although a cylindrical beam compressor can be conveniently mounted using a substrate edge, a compressor mount can be used and the beam compressor aligned within the mount as show in FIGS. 8A-8B. A cylindrical beam compressor 80l is retained in a frame 804 which can be provided with a surface 803 that is suitable for mounting without requiring rotational alignment. As shown in FIG. 8B, compressor has a convex surface 806 and a concave surface 808.

Figure 9:
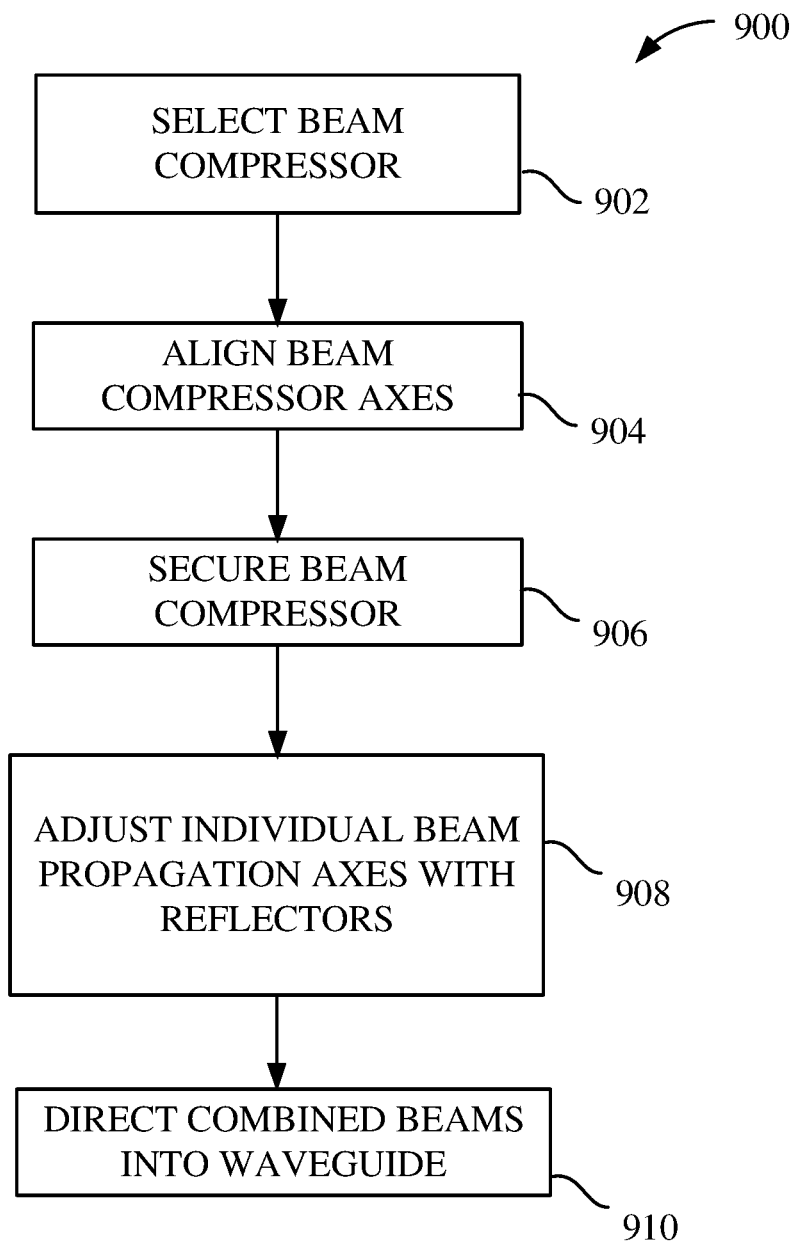
FIG. 9 illustrates a representative method of making a laser diode assembly.

Referring to FIG. 9, a method of fabricating a laser diode assembly that directs beams from a plurality of laser diodes into an optical fiber or other waveguide includes selecting a beam compressor and compression ratio at 902, typically to match a numerical aperture defined by a beam stack to a fiber numerical aperture. At 904, beam compressor axes are aligned with respect to a laser diode beam stack direction and at 906, the beam compressor is secured with respect to the laser diodes. In some cases, additional alignment is performed with reflectors associated with some or all of the laser diodes whose beams are to be combined at 908. At 910, the beams are directed into an optical fiber or other waveguide.

Figure 10:
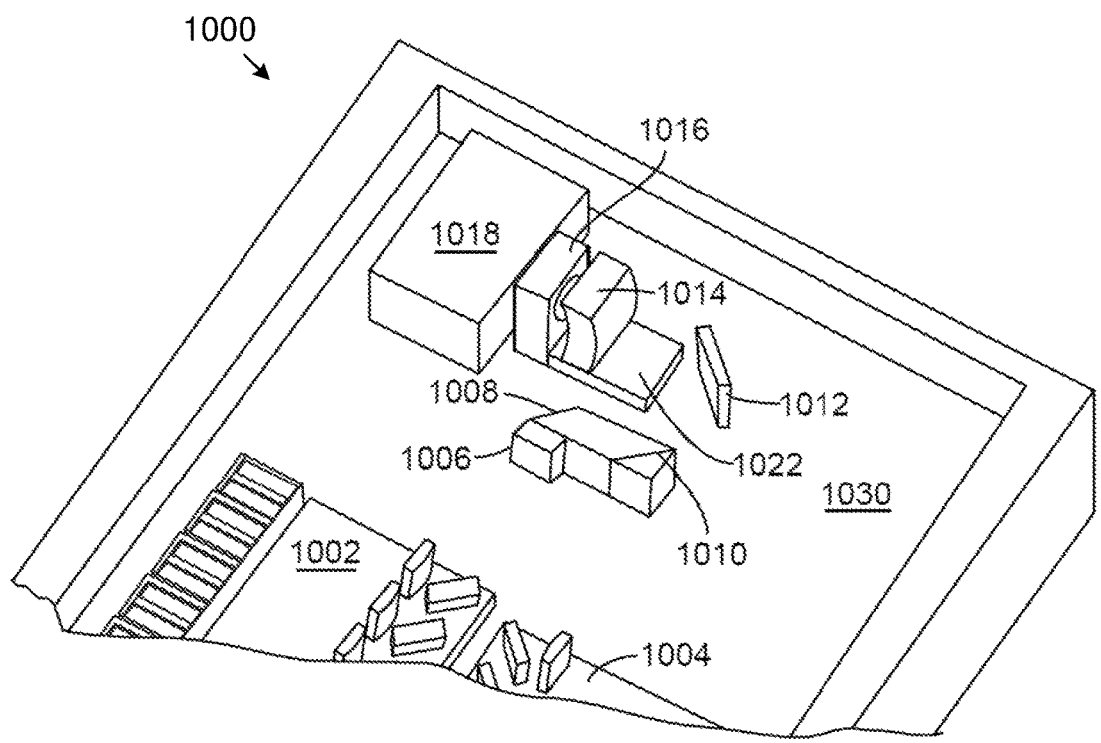
FIG. 10 is a perspective view of a portion of a laser diode assembly that includes a meniscus fast axis telescope.

As shown in FIG. 10, a representative laser diode assembly 1000 includes a first laser diode sub-assembly 1002 and a second laser diode subassembly 1004 that include laser diodes, fast and slow axis collimators, and turning mirrors. A half-wave retardation plate 1006 is situated to receive beams from the sub-assembly 1002 and a prism surface 1008 reflects the beams to a polarizing beam splitter 1010. The polarizing beam splitter 1010 is also situated to receive beams from the sub-assembly 1004 and produce a beam stack using beams from the first laser diode sub-assembly 1002 and the second laser diode subassembly 1004. The beam stack is then directed by a reflector 1012 to a singlet fast axis telescope (FAT) 1014 and to an objective lens 1016. A fiber module 1018 secures an input surface of an optical fiber so as to receive the beam stack from the objective lens 1016. The FAT 1014 can be secured to a base plate 1022 having a thickness selected to center the FAT 1014 with respect to the beam stack. As the FAT 1014 is arranged to compress the beam stack, an image of an input surface of the optical fiber of the fiber module remains available for inspection through the FAT 1014. By directing a viewing light flux into the optical fiber, the end surface is illuminated and then imaged by the objective lens 1016. This image can be accessed by viewing through the reflector 1012 if a dichroic reflector is used, by viewing prior to placement of the reflector 1012, or by inserting a reflector so as to direct the viewing flux out of a housing 1030.

Figure 11:
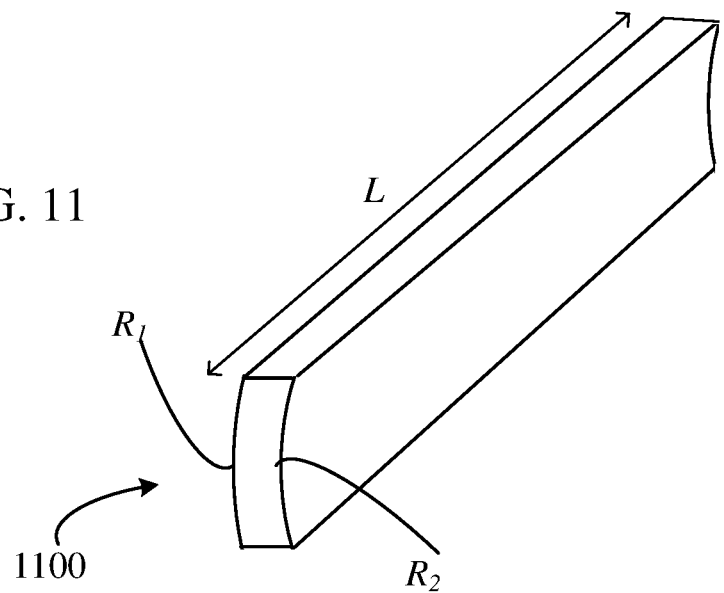
FIG. 11 illustrates a molded rod from which a plurality of fast axis telescopes can be obtained.

Fast axis telescopes or other beam compressors can be fabricated of materials such as optical glasses using conventional grinding and polishing operations. Alternatively, such components can be formed by molding plastic optical materials. In some cases, individual fast axis telescopes can be cut from a plastic rod having suitable inner and outer curvatures and thickness. For example, FIG. 11 illustrates a molded plastic rod 1100 of refractive index n on which cylindrical surface radii of curvature $R_1$ and $R_2$ are defined. A center thickness is selected so that $$T_C = \frac{n}{\Delta n}(R_1 + R_2)$$

as discussed above. A length L can be selected so that the plastic rod 1100 can be cut into N fast axis telescopes of approximate length L/N. Similarly, a molded glass rod can be divided into multiple fast axis telescopes. Molded optical components generally permit the use of aspheric surfaces with little additional complexity. Thus, molded optical components can take advantage of aspheric surfaces to reduce optical aberrations such as spherical aberration, if desired.

Having described and illustrated the principles of the disclosed technology with reference to the illustrated embodiments, it will be recognized that the illustrated embodiments can be modified in arrangement and detail without departing from such principles. The particular arrangements above are provided for convenient illustration, and other arrangements can be used. We claim all that is encompassed by the appended claims.

We claim:

1. A laser diode assembly, comprising:
   a plurality of laser diodes situated to direct a plurality of laser beams along respective beam axes that are displaced from and parallel to each other so as to establish initial beam displacements among the plurality of laser beams; and
   a unitary beam compressor situated to receive the laser beams having the initial beam displacements and produce laser output beams having reduced displacements, wherein the unitary beam compressor is a meniscus cylindrical lens defined on a transparent optical substrate having a flat reference surface that is parallel to an axis of the unitary beam compressor and to cylindrical axes of the meniscus cylindrical lens, and the unitary beam compressor is situated with respect to the beam axes with the flat reference surface.

2. The laser diode assembly of claim 1, further comprising;
   an objective lens situated to receive the laser beams from the unitary beam compressor and direct the laser beams to a beam focus.

3. The laser diode assembly of claim 2, further comprising an optical waveguide having an input surface situated at the beam focus.

4. The laser diode assembly of claim 3, further comprising a plurality of fast axis collimators and slow axis collimators situated to receive the plurality of laser beams and direct the plurality of laser beams along the respective beam axes to the unitary beam compressor.

5. The laser diode assembly of claim 4, wherein a beam entrance surface of the optically transparent substrate has a first radius of curvature and a beam exit surface of the optically transparent substrate has a second radius of curvature, wherein the first radius of curvature, the second radius of curvature, and a separation of the beam exit surface and the beam entrance surface is such that a compression ratio corresponds to a ratio of the second radius of curvature to the first radius of curvature.

6. The laser diode assembly of claim 5, wherein the optically transparent substrate is glass.

7. The laser diode assembly of claim 6, wherein the laser diodes of the plurality of laser diodes are situated so that associated beams are displaced from each other and propagate along parallel axes in a common plane, and axes of curvature of the unitary beam compressor are perpendicular to the common plane.

8. The laser diode assembly of claim 1, wherein the unitary beam compressor is an on-axis cylindrical lens having a convex surface of radius $R_1$ and a concave surface radius $R_2$ and having a center thickness such that the convex and concave surfaces have an optical separation based on a difference $|R_1|-|R_2|$.

9. The laser diode assembly of claim 8, wherein the on-axis cylindrical lens has a center thickness $T_C$ of about $$T_C = \frac{n}{n-1}(|R_1| - |R_2|),$$

wherein n is a refractive index of the centered cylindrical lens.

10. A method, comprising:
    securing a plurality of laser diodes with respect to each other so as to produce a beam stack that comprises beams from the plurality of laser diodes; and
    situating a unitary beam compressor with respect to the beam stack so as to alter a beam spacing in the beam stack, wherein the unitary beam compressor includes a cylindrical lens defined on a transparent optical substrate having a flat reference surface that is parallel to an axis of the unitary beam compressor and to cylindrical axes of the cylindrical lens, and the unitary beam compressor is situated with respect to the beam stack with the reference surface.

11. The method of claim 10, further comprising securing the unitary beam compressor with respect to the beam stack at the reference surface.

12. The laser diode assembly of claim 1, wherein the meniscus cylindrical lens has a first curvature and a second curvature that are associated with respective focal lengths $f_1$ and $f_2$, wherein $f_2<0$, a transparent substrate refractive index is n, and a center thickness $T_C=n(f_1+f_2)$.

13. The laser diode assembly of claim 1, wherein the meniscus cylindrical lens has a first curvature and a second curvature, wherein the first curvature and the second curvature are associated with respective radii of curvature $R_1$ and $R_2$, and a beam compression ratio $M=|R_2/R_1|$.

14. The laser diode assembly of claim 1, wherein the meniscus cylindrical lens has a first curvature and a second curvature, wherein the first curvature and the second curvature are associated with respective focal lengths $f_1$ and $f_2$, and a beam compression ratio M is $|f_2/f_1|$.

15. The laser diode assembly of claim 1, wherein a beam compression ratio is between 0.5 and 1.2.

16. The laser diode assembly of claim 1, wherein a beam compression ratio is between 0.65 and 0.92.

17. The laser diode assembly of claim 1, wherein the transparent optical substrate has a refractive index of at least 1.65.

18. The laser diode assembly of claim 1, wherein the transparent optical substrate has a refractive index between 1.65 and 1.85.

* * * * *